(12) United States Patent
Kim

(10) Patent No.: US 6,541,368 B2
(45) Date of Patent: Apr. 1, 2003

(54) METAL LINES OF SEMICONDUCTOR DEVICES AND METHODS FOR FORMING

(75) Inventor: Hyung Jun Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/186,902

(22) Filed: Jun. 28, 2002

(65) Prior Publication Data

US 2003/0003726 A1 Jan. 2, 2003

(30) Foreign Application Priority Data

Jun. 30, 2001 (KR) ........................................ 2001-39041

(51) Int. Cl.[7] ........................................ H01L 21/4763
(52) U.S. Cl. ................ 438/623; 438/624; 438/626; 438/631; 438/637; 438/666; 438/667; 438/668
(58) Field of Search ................ 438/623, 624, 438/626, 631, 637, 666, 664, 668

(56) References Cited

U.S. PATENT DOCUMENTS

| | | | | |
|---|---|---|---|---|
| 6,124,198 A | * | 9/2000 | Moslehi | 438/624 |
| 6,187,661 B1 | * | 2/2001 | Lou | 438/623 |
| 6,268,283 B1 | * | 7/2001 | Huang | 438/637 |
| 6,291,333 B1 | * | 9/2001 | Lou | 438/623 |
| 6,472,306 B1 | * | 10/2002 | Lee et al. | 438/623 |
| 6,472,312 B2 | * | 10/2002 | Bao et al. | 438/623 |

* cited by examiner

*Primary Examiner*—John F. Niebling
*Assistant Examiner*—Lynne Gurley
(74) *Attorney, Agent, or Firm*—Townsend and Townsend and Crew, LLP

(57) ABSTRACT

Metal lines of a semiconductor device and methods of forming same are disclosed. During a damascene process filling up a metal line in an insulating film, a low-k layer is used as an insulating film. An anchor groove is formed in one portion of the low-k layer. The anchor groove is filled up with an anchor layer. A metal line is formed, which contacts one or more underlying layers through the anchor layer and the interlayer isolation film. As a result, it is possible to prevent a distortion of a metal line and/or damage to a hard-mask layer, thereby improving device productivity and yield.

12 Claims, 6 Drawing Sheets

METAL LINES OF SEMICONDUCTOR DEVICES AND METHODS FOR FORMING

BACKGROUND OF THE INVENTION

1. Field of the Invention

The present invention generally relates to semiconductor devices and methods of forming same, and in particular, to devices, methods and technologies for preventing a metal line from becoming distorted or a hard-mask layer from being removed during a subsequent chemical-mechanical polishing (CMP) process.

2. Description of the Background Art

A semiconductor device generally comprises a capacitor and a transistor. In order to operate the capacitor and the transistor as a circuit, a metal line is required. According to a conventional method of forming a metal line, a lower insulating layer comprising a word line, a bit line and a capacitor is formed on a semiconductor substrate. Then, a lower insulation film and a material for a metal line are formed. The material for the metal line is patterned to form a metal line pattern. The metal line may be patterned by etching using a metal line mask. To achieve a high-integration of the semiconductor device, a microscopic metal line is used. However, it is difficult to form such a metal line of microscopic scale by etching processes using the metal line mask.

Recently, in order to form a micro-pattern sufficient for high-integration, a metal line is formed using a damascene process. The damascene process includes forming an interlayer isolation film, etching a predetermined region of the interlayer isolation film where a metal line will be formed, and filling up the etched portion of the interlayer isolation film with a metal line material.

In the damascene process of forming a metal line, an insulating layer with a low dielectric constant (k) is used as an interlayer isolation film to prevent deterioration of the device characteristics. An insulating layer with a low dielectric constant also typically has very low stiffness. As a result, during a subsequent chemical-mechanical polishing (CMP) process, the metal line is distorted due to shear stress. Also, an oxide film or nitride film used as a hard-mask formed on an upper part of the low-k layer may be undesirably removed by shear stress during the CMP process.

FIG. 1 is a picture illustrating a metal line formed according to a conventional method, which is distorted by CMP shear stresses.

BRIEF SUMMARY OF THE INVENTION

Accordingly, the present invention provides methods of forming a metal line of a semiconductor device so that a device can be formed easily without destroying a pattern or a stacked layer during a CMP process. The present invention will be particularly useful for damascene processes using a low-k isolation layer.

In one embodiment of the present invention, a method of forming a metal line of a semiconductor device includes forming a lower insulating layer on a semiconductor device having a substructure, forming an interlayer isolation film with a low-k layer on the lower insulating layer, forming an anchor groove by etching one portion of the interlayer isolation film to expose the lower insulating layer, filling up the anchor groove by forming an anchor layer on the whole surface of the resulting structure, and planarizing an upper portion of the anchor layer. The method further includes forming a groove by sequentially removing a portion of the anchor layer and a second portion of the interlayer isolation film, and forming a metal line filling up the groove by a damascene process.

In one aspect, the low-k layer includes a spin on polymer (SOP), and in another aspect the anchor layer includes a silicon oxide or silicon dioxide ($SiO_2$) film which has a stiffness that is stronger than the low-k layer stiffness.

Another embodiment of the present invention involves a method of forming a metal line of a semiconductor device. The method includes forming a lower insulating layer on a semiconductor substrate having a substructure, and forming an interlayer isolation film comprising a low-k layer over the lower insulating layer, with the interlayer isolation film having an anchor layer pattern defining an anchor hole therethrough to the lower insulating layer. A hard-mask layer is formed over exposed portions of the anchor layer pattern and interlayer isolation film, and a groove is formed by sequentially removing a portion of the hard-mask layer and the interlayer isolation film. The method includes forming a metal line filling up the groove by a damascene process.

In one aspect, the hard-mask layer comprises a $SiO_2$ film. In some aspects, the anchor layer pattern comprises a plurality of anchors formed in a plurality of anchor holes through the interlayer isolation film. In one aspect, the anchor layer pattern further includes a substantially planar anchor film overlying at least some of the plurality of anchors. The groove for the metal line may be formed by also removing a portion of the anchor film.

In still another embodiment of the present invention, a method of forming a metal line of a semiconductor device includes forming a lower insulating layer on a semiconductor device having a substructure, forming an anchor layer on the lower insulating layer, removing a portion of the anchor layer to define a plurality of spaced apart anchors, and forming a second insulating layer over the lower insulating layer. A hard mask layer is formed over the second insulating layer and over the spaced apart anchors, and a groove is formed in the hard mask layer and second insulating layer at a location spaced apart from the plurality of anchors. A metal line is formed in the groove.

In one aspect, the second insulating layer also is formed over the spaced apart anchors, and then planarized to expose the spaced apart anchors.

The present invention further provides exemplary semiconductor devices, and metal lines of a semiconductor device. In one embodiment the metal line comprises a lower insulating layer formed on a semiconductor substrate having a substructure, an interlayer isolation film formed of a low-k layer disposed on the lower insulating film, an anchor layer connected to the lower insulating layer through a hole formed in a first portion of the interlayer isolation film, and a metal line filling up a groove defined in a portion of the anchor layer and in a second portion of the interlayer isolation film.

In one aspect, a hard-mask layer is provided between the anchor layer and the metal line.

Other features and advantages of the invention will appear from the following description in which the preferred embodiments have been set forth in detail in conjunction with the accompanying drawings.

BRIEF DESCRIPTION OF THE DRAWINGS

The present invention will become better understood with reference to the accompanying drawings which are given only by way of illustration and thus are not limiting of the present invention, wherein.

DETAILED DESCRIPTION OF THE INVENTION

With reference to the accompanying drawings, semiconductor devices and methods of forming same in accordance with the present invention will now be described in detail.

FIGS. 2A through 2E are diagrams illustrating methods of forming a metal line of a semiconductor device in accordance with one embodiment of the present invention. Metal lines of the present invention may be formed in a circuit device formed on a substrate (not shown), such as a silicon substrate. The substrate typically has one or more substructures (not shown), such as a field oxide defining an active region, a word line, a bit line, a capacitor and the like. A planarized lower insulating layer 11 is formed over the whole surface of the structure, and a low-k layer 13 is formed on the lower insulating layer 11. Low-k layer 13 is used as an interlayer isolation film 13. In a particular embodiment, interlayer isolation film 13 comprises a spin-on polymer (SOP), although it will be appreciated by those skilled in the art that additional materials also may be used for interlayer isolation film 13.

Figure 1:
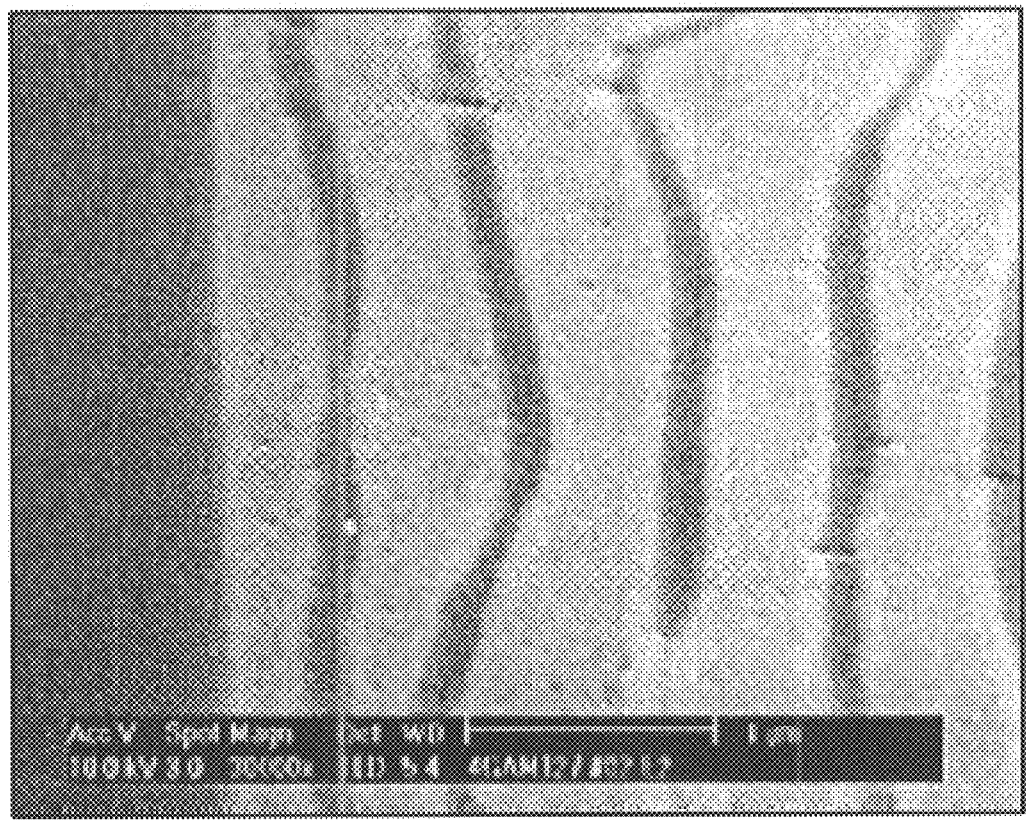
FIG. 1 is a photograph illustrating problems of a conventional method of forming a metal line.
Figure 2A:
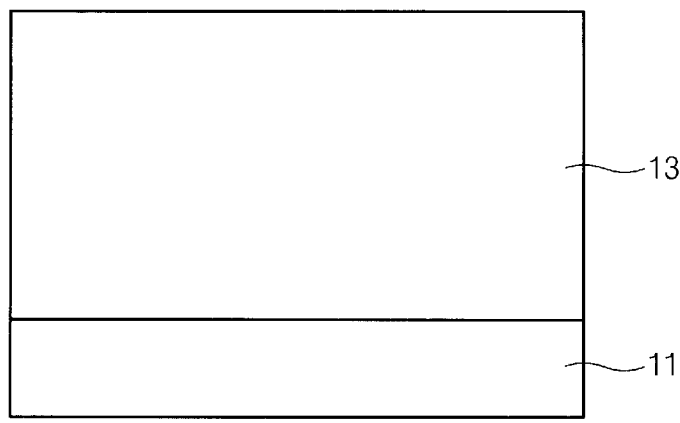
FIGS. 2A–2E are diagrams illustrating methods of forming a metal line of a semiconductor device in accordance with an embodiment of the present invention.
Figure 2B:
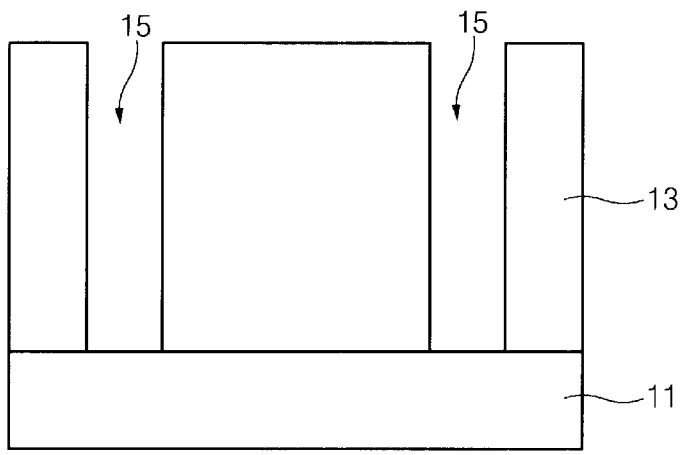

Referring to FIG. 2B, an anchor groove 15, where an anchor can be formed, is formed in one portion of the low-k layer 13. Here, anchor groove 15 is formed on a portion where a metal line is not to be formed.

Figure 2C:
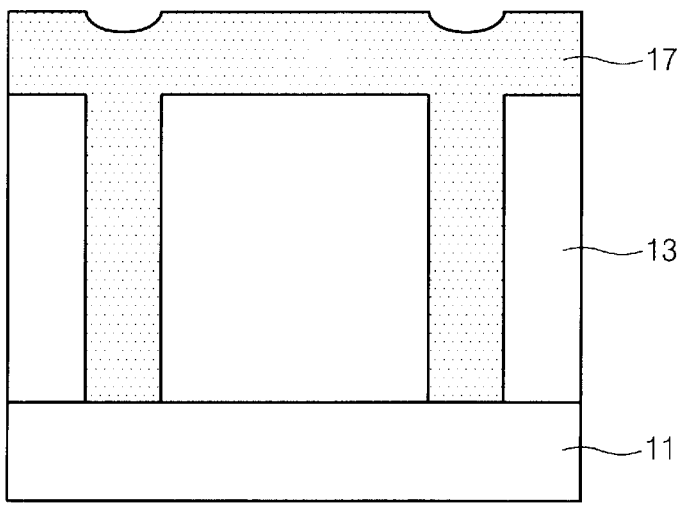

Referring to FIG. 2C, an anchor layer 17 filling up the anchor groove 15 is formed on the whole surface of the structure to contact the lower insulating layer 11. In one embodiment, anchor layer 17 is formed with a material having a stronger stiffness than the stiffness of low-k layer 13. In a particular embodiment, anchor layer 17 comprises silicon dioxide ($SiO_2$).

Figure 2D:
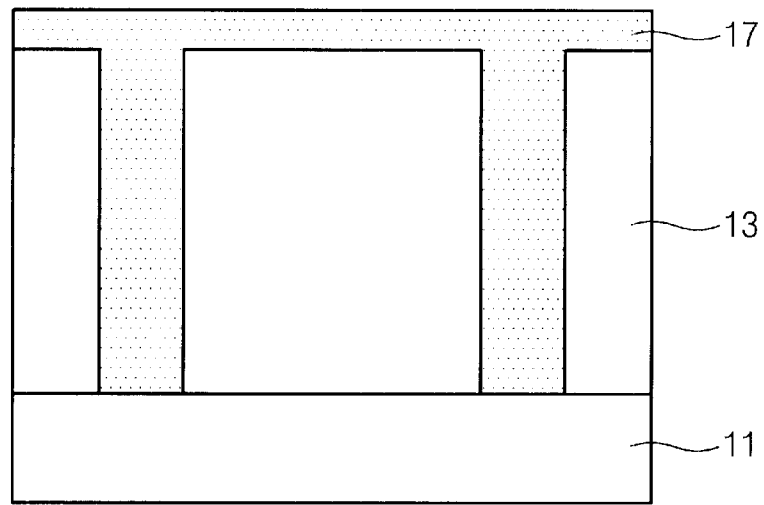
Figure 2E:
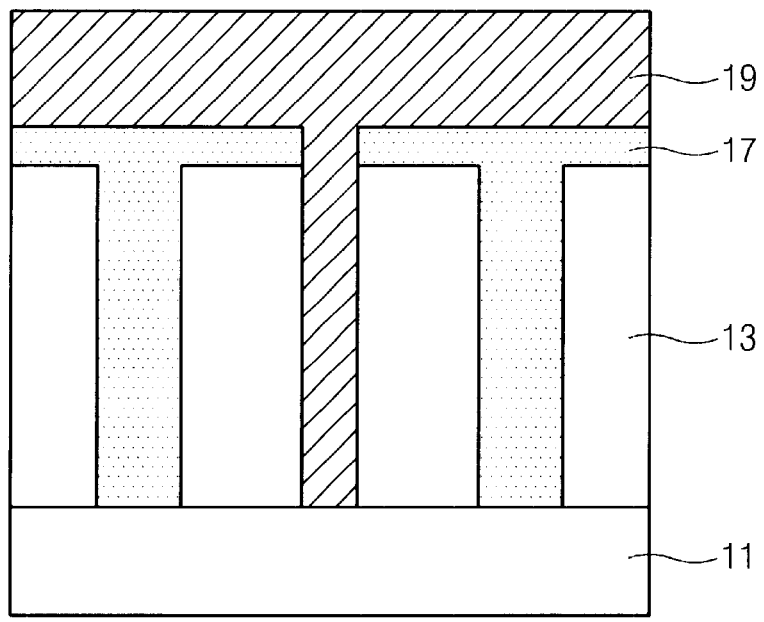

Referring to FIG. 2D, an upper portion of the anchor layer 17 is planarized by a CMP process. As seen in FIG. 2E, a groove is formed by sequentially removing, at a predetermined region for a metal line, portions of anchor layer 17 and interlayer isolation film 13. Then, a metal line 19 is formed by a damascene process using a metal line mask, with the metal line 19 filling or substantially filling the groove.

Turning now to FIGS. 3A through 3E, which depict methods of forming a metal line of a semiconductor device, another embodiment of the present invention will be described.

Figure 3A:
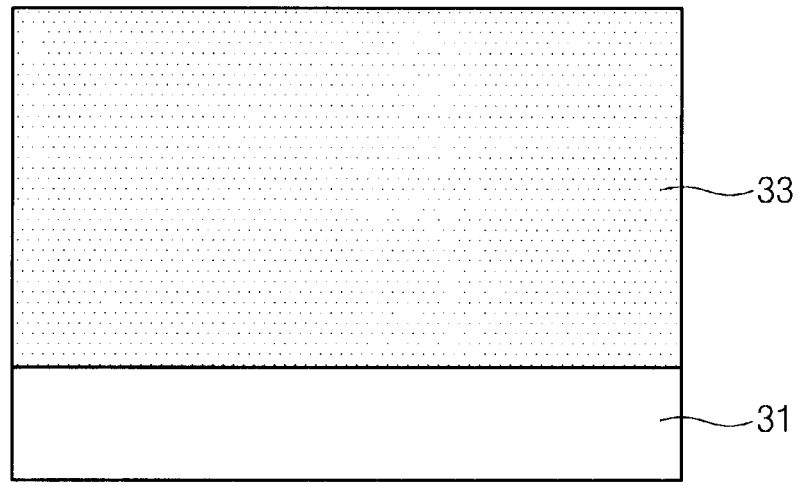
FIGS. 3A–3E are diagrams illustrating methods of forming a metal line of a semiconductor device in accordance with another embodiment of the present invention.

As seen in FIG. 3A, an anchor layer 33 is formed on a planarized lower insulating layer 31, which is formed on the semiconductor substrate comprising substructures such as a field oxide defining an active region of a semiconductor device, a word line, a bit line, a capacitor and the like. In one embodiment, anchor layer 33 is composed of a silicon oxide film.

Figure 3B:
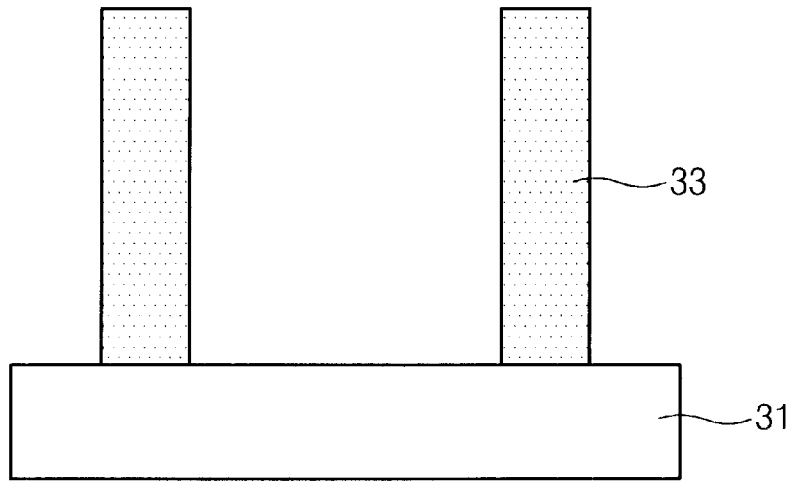

Referring to FIG. 3B, an anchor layer pattern is formed, such as by etching the anchor layer 33 with a photolithography process using a mask for the anchor layer (not shown). The mask for the anchor layer is designed to form an anchor layer pattern in a region other than a metal line region formed in a subsequent process. Here, anchor layer 33 pattern is formed in a region other than a contact region of a metal line. Anchor layer 33 pattern has a structure that is vertical or substantially vertical to the planarized lower insulating layer 31, and is disposed in an interlayer isolation film formed in a subsequent process.

Figure 3C:
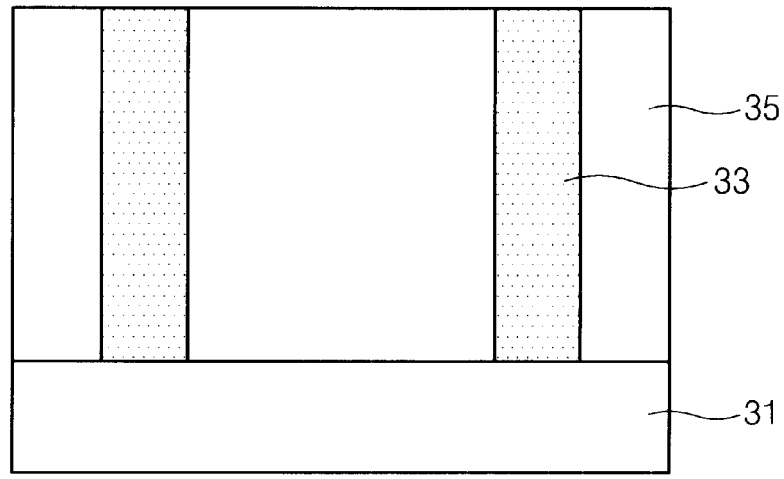
Figure 3D:
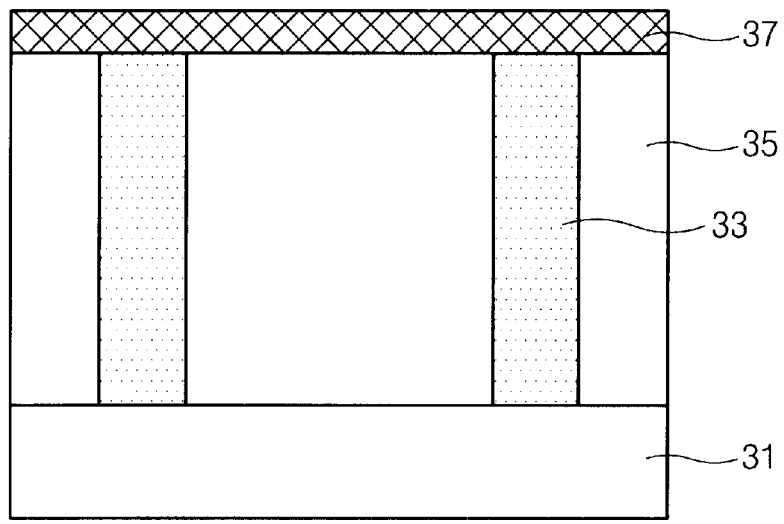

Referring to FIG. 3C, an interlayer isolation film 35 is formed on an upper portion of the whole surface. In one embodiment, interlayer isolation film 35 comprises a low-k layer such as a SOP. As seen in FIG. 3D, a hard-mask layer 37 is formed on an upper portion of the whole structure by removing an upper portion of the interlayer isolation film 35 with a CMP process to expose anchor layer 33 pattern. In a particular embodiment, the hard-mask layer 37 includes or consists of a silicon oxide film.

Figure 3E:
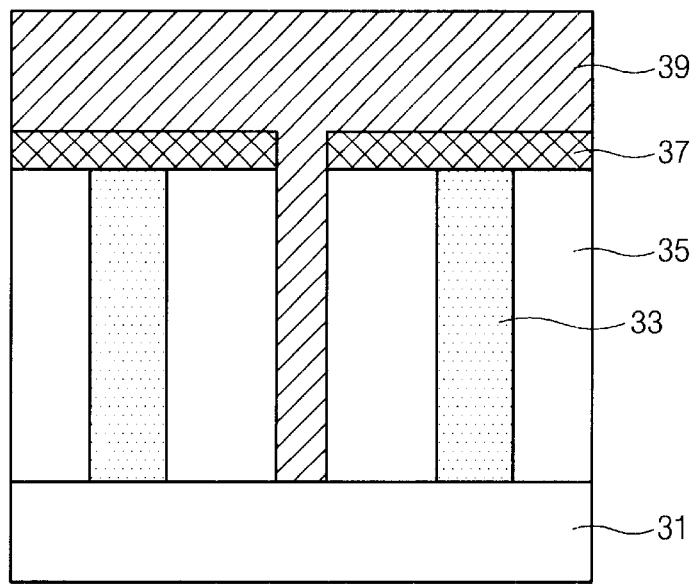

Referring to FIG. 3E, a metal line 39 is formed with a damascene process using a metal line contact mask and a metal line mask. Metal line 39 is formed by penetrating hard-mask layer 37 and interlayer isolation film 35. For example, a trench, hole, groove or the like may be formed through hard-mask layer 37 and interlayer isolation film 35 at a desired metal line location. The trench, hole, groove or the like is subsequently filled with a metal.

Figure 4:
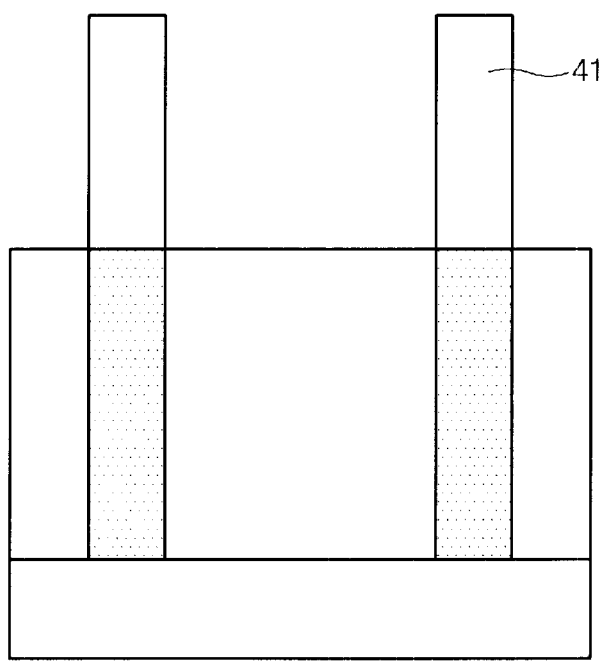
FIG. 4 is a cross-sectional diagram illustrating still another method of forming a metal line of a semiconductor device according to the present invention.

FIG. 4 is a cross-sectional diagram illustrating another method of forming a metal line of a semiconductor device in accordance with an embodiment of the present invention. It shows a process of forming a low-k layer 41 after the process of FIG. 3C. Low-k layer 41 may be formed, for example, using a chemical vapor deposition (CVD) process. A metal line is formed by performing a process shown in FIG. 3D as a subsequent process.

As described earlier, in accordance with the present invention, in a damascene process of forming a metal line using a low-k layer as an interlayer isolation film, an anchor layer is formed in an interlayer isolation film. The anchor layer prevents or helps prevent a metal line from being distorted during a subsequent CMP process. The anchor layer also prevents or helps prevent an oxide film or a nitride film used as a hard-mask layer from coming off. As a result, characteristics and reliability of the device are improved.

The present invention has been described in an illustrative manner, and it is to be understood that the terminology used is intended to be in the nature of description rather than of limitation. Many modifications and variations of the present invention are possible in light of the above teachings. By way of example and not limitation, the anchor layer may have an upper portion coupled to some or all anchors as can be seen in FIGS. 2D and 2E, or it may not. Further, a hard mask layer may be used, within the scope of the present invention, in the embodiment described in FIGS. 2A–2E. Therefore, it is to be understood that within the scope of the appended claims, the invention may be practiced in ways other than those specifically described.

What is claimed is:

1. A method of forming a metal line of a semiconductor device, the method comprising:

forming a lower insulating layer on a semiconductor device having a substructure;

forming an interlayer isolation film with a low-k layer on the lower insulating layer;

forming an anchor groove by etching a first portion of the interlayer isolation film to expose the lower insulating layer;

filling up the anchor groove by forming an anchor layer on the whole surface of the resulting structure;

planarizing an upper portion of the anchor layer;

forming a groove by sequentially removing a portion of the anchor layer and a second portion of the interlayer isolation film; and forming a metal line filling up the groove by a damascene process.

2. The method according to claim 1, wherein the low-k layer comprises a spin-on polymer (SOP).

3. The method according to claim 1, wherein the anchor layer comprises a silicon dioxide ($SiO_2$) film which has a stiffness that is stronger than a low-k layer stiffness.

4. A method of forming a metal line of a semiconductor device, the method comprising:

forming a lower insulating layer on a semiconductor substrate having a substructure;

forming an interlayer isolation film comprising a low-k layer over the lower insulating layer, the interlayer isolation film having an anchor layer pattern defining an anchor hole therethrough to the lower insulating layer;

forming a hard-mask layer over exposed portions of the anchor layer pattern and interlayer isolation film;

forming a groove by sequentially removing a portion of the hard-mask layer and the interlayer isolation film; and forming a metal line filling up the groove by a damascene process.

5. The method according to claim 4, wherein the anchor layer comprises a $SiO_2$ film.

6. The method according to claim 4, wherein the low-k layer comprises a SOP.

7. The method according to claim 4, wherein the hard-mask layer comprises a $SiO_2$ film.

8. The method according to claim 4, wherein the anchor layer pattern comprises a plurality of anchors formed in a plurality of anchor holes through the interlayer isolation film.

9. The method according to claim 8, wherein the anchor layer pattern further comprises a substantially planar anchor film overlying at least some of the plurality of anchors.

10. The method according to claim 9, wherein forming the groove further comprises removing a portion of the anchor film.

11. A method of forming a metal line of a semiconductor device, the method comprising:

forming a lower insulating layer on a semiconductor device having a substructure;

forming an anchor layer on the lower insulating layer;

removing a portion of the anchor layer to define a plurality of spaced apart anchors;

forming a second insulating layer over the lower insulating layer;

forming a hard mask layer over the second insulating layer and over the spaced apart anchors;

forming a groove in the hard mask layer and second insulating layer at a location spaced apart from the plurality of anchors; and forming a metal line in the groove.

12. The method as in claim 11, wherein forming the second insulating layer further comprises forming the second insulating layer over the spaced apart anchors, and then planarizing the second insulating layer to expose the spaced apart anchors.

* * * * *